United States Patent [19]
Tighe et al.

[11] Patent Number: 5,970,608
[45] Date of Patent: Oct. 26, 1999

[54] CRYOGENIC FLEX CABLE CONNECTOR

[75] Inventors: Thomas S. Tighe, Pasadena; Gershon Akerling, Culver City, both of Calif.

[73] Assignee: TRW Inc., Redondo Beach, Calif.

[21] Appl. No.: 09/174,953

[22] Filed: Oct. 19, 1998

Related U.S. Application Data

[62] Division of application No. 08/886,312, Jul. 1, 1997.

[51] Int. Cl.⁶ .................................................. H01R 43/02
[52] U.S. Cl. ................................ 29/843; 29/830; 29/879; 174/117 F
[58] Field of Search .............................. 29/830, 842, 843, 29/844, 878, 879; 174/117 F, 117 FF, 262; 228/56.3, 120, 122, 160, 254, 259

[56] References Cited

U.S. PATENT DOCUMENTS

| | | | |
|---|---|---|---|
| 4,184,729 | 1/1980 | Parks et al. | 339/17 F |
| 4,850,883 | 7/1989 | Kabadi | 439/67 |
| 5,009,605 | 4/1991 | Crumly et al. | 439/67 |
| 5,269,453 | 12/1993 | Melton et al. | 228/180.22 |
| 5,435,732 | 7/1995 | Angulas et al. | 439/67 |

*Primary Examiner*—Lee Young
*Assistant Examiner*—Kevin G. Vereene
*Attorney, Agent, or Firm*—Michael S. Yatsko; Ronald M. Goldman

[57] ABSTRACT

A new electrical connector system employs two printed circuit board type connector components (1 & 3), each containing a plurality of plated-on metal lines (11 & 13) running along the board in parallel, and a replaceable contact element (9), termed an interposer, that is sandwiched between those printed circuit boards. The interposer contains malleable electrical contacts (15 & 17) on each side that extend electrically from one surface to the other and serves as a contact bridge for those connector contacts. The interposer is formed as a thin insulator strip and metal bumps on the top and bottom sides of the strip serve as the electrical contacts. Bridging connection for metal bumps on the top side with associated bumps on the bottom side is served with plated-through holes (16). The metal bumps are of Indium and Tin that is covered by a flash of Gold. Ancillary to the described connector, a new method for constructing an electrical connector is also presented.

5 Claims, 5 Drawing Sheets

CRYOGENIC FLEX CABLE CONNECTOR

This is a division of application Ser. No. 08/886,312, filed Jul. 1, 1997.

FIELD OF THE INVENTION

This invention relates to electrical connectors, and, more particularly, to a flex cable connector system useful in cryogenic environments.

BACKGROUND

A number of companies, such as IBM and Packard-Hughes, produce high density flexible electrical cables, often referred to as "flex cable", for use in routing electronic data. These cables have the capability of routing data at high rates of up to 10 Gigabits per second. The cable is relatively flat and resembles a thick stiff belt in appearance and it may be bent around corners or wrapped, much like an ordinary leather belt. The flex cables pack a large number of separate insulated electrical lines within the flex cable's limited width, typically at a line density greater than eighty signal lines per inch. In its construction, the flex cables employ a polyimide film, a strong flexible plastic insulating material, as the dielectric substrate and outer insulating wrap. The electrical lines are lithographically defined and are formed of a very thin and narrow metal strips upon the dielectic substrate and a covering layer of the same material is laminated to that substrate covering the metal strips.

The foregoing flex cables may be designed to have low thermal conductivity, a characteristic which makes the cable ideal for cryogenic applications. The cables can be used to connect cryogenic electronics apparatus, superconducting electronic apparatus, cryo-CMOS circuits and cooled GaAs amplifiers, which a cryogenic refrigeration system maintains at very low cryogenic temperatures during operation, to other external electronic components and circuits that are maintained at room temperature. Since the cable doesn't conduct significant external heat to the cryogenic apparatus, the cable does not create an undue heat load on the cryogenic refrigeration system.

For expeditious cable connection and/or disconnection, electrical connectors are employed with the cable. Respective lengths of cable are wired into respective electrical connectors and the lengths of cable are interconnected by connecting the two mating electrical connectors together, as is conventional practice in the electronic field.

As is elementary, an electrical connector contains a sufficient number of spaced electrical contacts, enabling each connector contact to be electrically connected to a respective electrical lead in the cable. A cable to cable connection is made by mating two connectors or connector portions, as variously termed, together, to form the connector system or connection, and bridging the multiple electrical paths from one cable to another through the connector contacts. To avoid possible confusion in this description, it is appropriate to remind the reader that each mating half or portion of a connector system is customarily also referred to as a connector. When reference is made to connector, thus, the reader should be certain to understand the context in which the reference is made to understand whether reference is being made to a connector portion or to the connector system.

The electrical connectors used by the afore-recited flex cable manufacturers to connect flex cables together or to connect flex cables to rigid printed circuit boards employ a "pressed contact" arrangement. The pressed contact arrangement is not the typical male-female prong and socket contact arrangement found in conventional electrical connectors, in which a prong contact frictionally engages within a socket contact. Instead, in the situation in which two flex cables are to be joined, two substantially identical relatively planar thick rigid printed circuit boards, containing the requisite number of electrical lines formed slightly protruding above the circuit board's planar surface serve as the mating connectors. And, in the situation in which a flex cable is to be connected to a printed circuit board, the flex cable and the rigid printed circuit board, containing the requisite number of electrical lines protruding slightly above the planar surface of the circuit board, serve as the mating connectors.

As those skilled in the art appreciate, for a cable to cable connection, the electrical lines plated upon each of those circuit boards is aligned and soldered or otherwise joined to corresponding electrical leads at an end of an associated flex cable, typically by conventional soldering techniques. One of the circuit boards in the connector is inverted relative to the other and, with the electrical lines on the circuit boards aligned, the boards are pressed into engagement to place the respective lines in electrical contact and form the electrical connection. To complete the connector, a mechanical fastening system, including alignment pins and a pressure pad of elastomeric material clamps the mated connector portions together and maintains the respective parallel conductors in contact under a positive pressure or force. The surface of pressure pad contains a series of minute elastic rubber-like bumps or fingers to press against the top of one of the circuit boards, providing, thus, the pressed contact arrangement.

Although the foregoing connector design serves well at room temperature, at cryogenic temperature the connector, and, particularly, the connector's elastomeric pad, often fails to function properly. At cryogenic temperature, the elastomeric material forming the pressure pads becomes brittle and loses its ability to maintain adequate pressure on the circuit boards. As example, where the connector connects eighty or so electrical lines in a high density flex cable, should any one or those electrical lines fail to connect through the connector to an associated line, the connector is deemed to have failed. The loss of any electrical path through the connector cannot be tolerated. Thus, although available flex cable is ideal for application in cryogenic devices, presently available connectors for those flex cables are unsuited for use at those very low temperatures.

When the foregoing connector fails, it must be replaced. To do so requires the cable to be disconnected from the old structure and reattached and soldered to the replacement or requires a new cable to be attached and soldered. In addition to requiring new connectors, that procedure also requires considerable time and expense.

An object of the present invention, therefore, is to provide a new connector system for flex cable that functions at cryogenic temperatures.

A further object of the invention is to provide a connector system that may be easily repaired or reconstructed without requiring cable rewiring anew, should the connector system fail.

Another object of the invention is to provide a connector system that adapts flex cables to cryogenic device application and may be used in cryogenic systems.

And a still further object of the invention is to provide a positive pressure contact type connector that does not incorporate elastomeric material or any other material that becomes brittle or disfunctional at cryogenic temperatures.

SUMMARY OF THE INVENTION

In accordance with the foregoing objects, an embodiment of the present invention employs two printed circuit board type connector components or connectors, each containing a plurality of plated-on metal lines running along the board in parallel, that serve as the connector contacts, and a replaceable contact bridging element, termed an interposer, that is sandwiched between those two circuit boards and engages those circuit boards under a positive force. The interposer contains electrical contacts on each side that extend electrically from one surface to the other and serves as a contact bridge for those connector contacts. Each contact is placed in engagement with a corresponding line on the two circuit boards to electrically connect the lines.

In accordance with an aspect of the invention the interposer is formed as a thin strip of electrically insulative material and the interposer's contacts are small malleable metal bumps on the top and bottom sides of the strip. In accordance with a still further aspect to the invention electrical bridging between a metal bump on the top side and an associated bump on the bottom side is accomplished with plated-through holes. And, in accordance with a still further aspect, the metal bumps are formed of an alloy of Indium and Tin and, preferably, the Indium-Tin alloy is covered by a flash layer of Gold.

Advantageously, any thermally induced constriction that occurs through lowering of temperature to cryogenic levels enhances the electrical contact. Should the pressure become too great, by design, the metal bumps would yield, but maintain the electrical connection nonetheless. When the connector is released upon completion of one cryogenic operation and readied for reuse in a subsequent cryogenic operation, any distortion of the metal bumps resulting from the former operation as might cause failure of the connector system, is easily remedied by discarding the suspect interposer and replacing that interposer with a new one. No rewiring of cables is required. The foregoing new connector may be supplied with ample supplies of replaceable interposer elements, assuring the integrity of the electrical cabling for each and every cryogenic operation.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF THE PREFERRED EMBODIMENTS

Figure 1:
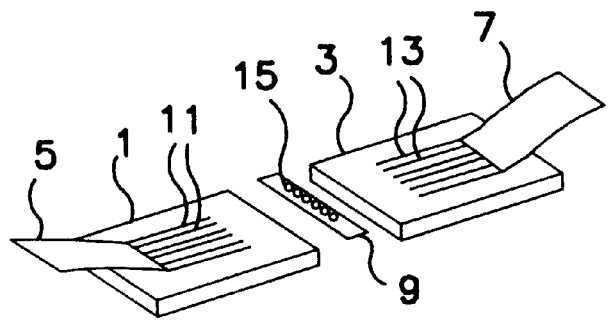
FIG. 1 is a pictorial view of the an embodiment of the connector prior to final assembly.
Figure 2:
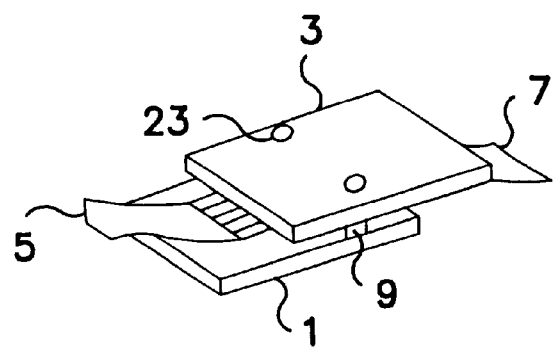
FIG. 2 is a pictorial view of the embodiment as assembled with the components sandwiched together to form the connector.
Figure 3:
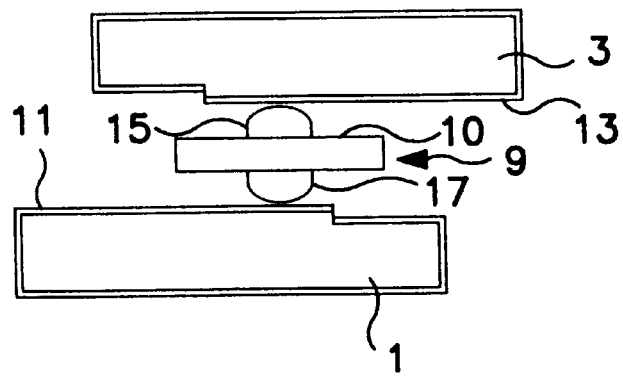
FIG. 3 is a partial side view of the embodiment of FIG. 2 drawn to a larger scale.

Reference is made to FIGS. 1, 2 and 3 which pictorially illustrate the principal elements of the disclosed electrical connector or, as variously termed, electrical connector system. Referring first to FIG. 1, the connector, shown partially dissassembled, contains a pair of printed circuit boards 1 and 3 and a small flat strip 9, here called an "interposer". The connector is illustrated as part of a cable to cable connection system, and printed circuit boards are attached to respective flexible cables 5 and 7. As shown in partially assembled form in FIG. 2, the printed circuit boards 1 and 3 are placed one atop the other, with printed circuit board 3 inverted, and interposer 9 is sandwiched in between.

Referring again to FIG. 1, circuit board 1 contains multiple parallel metal electrical traces or lines 11 spaced apart on the board's top surface. As is conventional with circuit boards, the metal lines are plated or otherwise bonded to the circuit board surface using known processes and suitably comprise Gold plated Copper. Electrical lines 11 are electrically connected to corresponding electrical leads in the associated cable 5 at the rear end of the circuit board. Likewise circuit board 3 contains identically spaced parallel metal electrical lines 13 on its top surface and is similarly electrically connected to like electrical leads in cable 7 associated therewith. Interposer 9 contains like laterally spaced malleable metal bumps 15 on its top surface, and, not visible in this figure, also contains corresponding spaced malleable metal bumps on its underside surface as well. Each metal bump on the top surface is aligned with a corresponding one of the metal bumps on the bottom surface of the interposer, which is visible in FIG. 3, next described.

Reference is made to FIG. 3, which provides a side view of a portion of FIG. 2, drawn to a larger scale, to better illustrate, the metal bumps 15 and 17 on the respective upper and lower surfaces of strip 9. The metal bumps are attached to and supported by a thin strip 10 of flexible electrical insulating material, preferably a polyimide film, and protrude slightly from the surface of the film. Metal bump 15 on the top surface, only one of which is shown, is in contact with an overlying electrical line 15; and the metal bump 17 on the underside, vertically aligned with bump 15, is in contact with an underlying one of the electrical lines 11 on circuit board 1.

Film strip 10 contains a number of cylindrical passages or holes, represented by dash lines, extending through the strip's thickness that correspond in number to the number of bumps on the top surface. Each of those holes is in alignment with a respective pair of top and bottom positioned metal bumps, such as that illustrated for metal bumps 15 and 17. Further, the holes are "Plated-through" with metal, such as copper. That is, the walls defining the hole are metalized or plated with metal, and are formed by an entirely conventional process long known in the printed circuit board art. The plated-thru metal cylinder so formed electrically connects at each end to a respective metal bump, 15 and 17. It is appreciated, thus, that when assembled together as illustrated in FIG. 3, the completed connector serves to provide an electrical path through the connector for each of the electrical lines in the associated cables.

Metal bumps 15 and 17 are formed of an alloy of Indium and Tin, which, as later herein discussed, has the desirable characteristic of being malleable. A preferred composition to that alloy is 52% Indium and 48% Tin. Because Indium-Tin could form dendrites allowing physically contacting Indium-Tin bumps to possibly "grow" together, which would make disassembly of the connector difficult, the Indium-Tin bumps are preferably flash plated with Gold. Because Gold is non-corrosive and does not become "sticky" the interposer is more easily detached from the associated printed circuit boards of the connector and allows the connector to be more easily disassembled.

The foregoing pictorial illustrations afford introduction to the new connector structure and illustrate its general design principals using a limited number of electrical contacts. A more complete illustration is provided in the succeeding drawing figures, which are next considered. For convenience in the following figures, the same number designation is given to an element that corresponds to an element previously identified in FIGS. 1–3.

Figure 5:
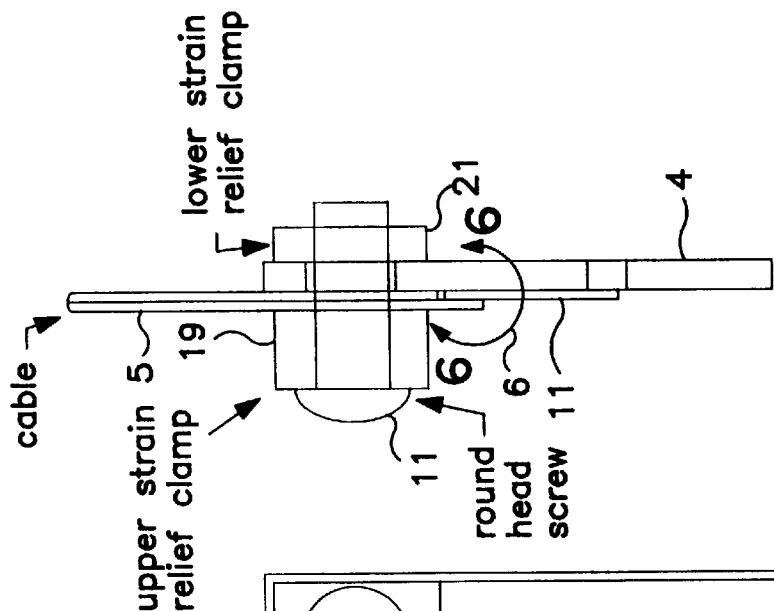
FIG. 5 illustrates the connector component of FIG. 4 in side view.
Figure 4:
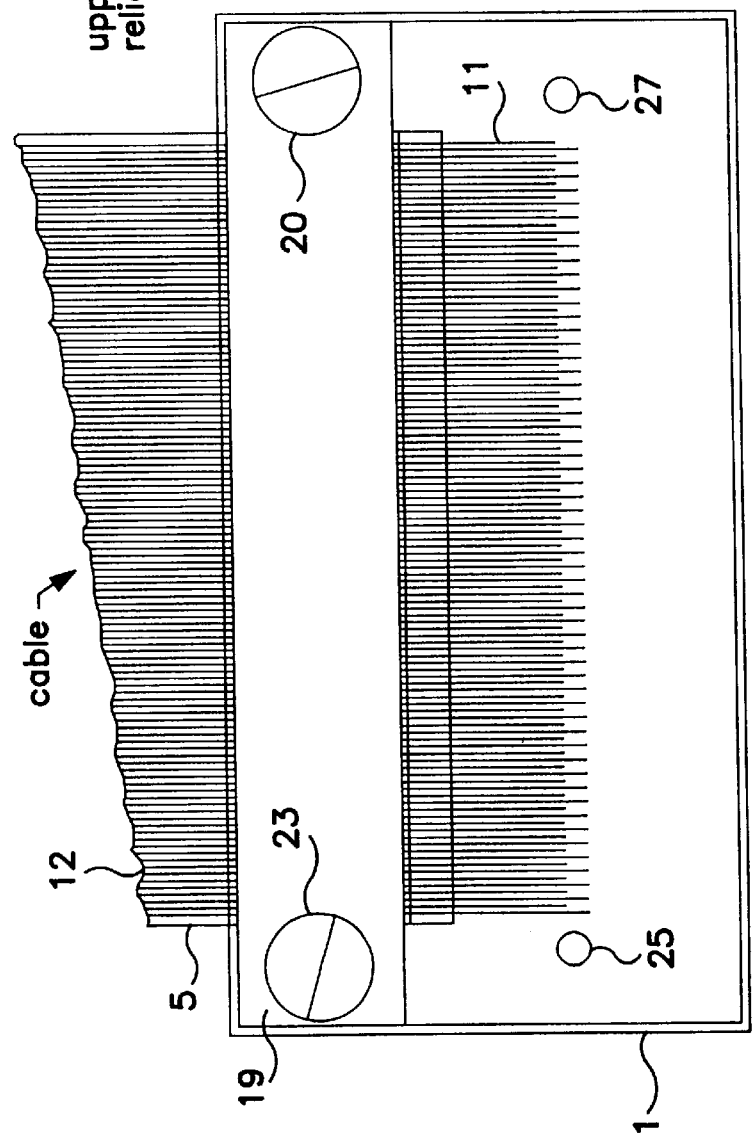
FIG. 4 is a top plan view of once of the interposer component of the connector.

A more typical cable or connector structure is presented in top plan view in FIG. 4 and in side view in FIG. 5, to which reference is made. Cable 5, partially illustrated, is a typical high density cable. It contains 128 parallel electrical lines or, as variously termed, signal traces 12 that are of three mils line width on an eight mil pitch laminated between thin layers of polyimide. The corresponding relatively rigid circuit board 1 contains a like number of lines or traces 11 of like width and pitch. To give a better feel to the small sizes possible for the connector invention, it is noted that in a practical embodiment of the connector of FIG. 4, the width of the connector, along the X-direction in the figure, is about 1.33 inches, and the length of the connector, along the Y-direction in the figure is about 0.7 inches.

The cable is attached to the printed circuit board and the individual leads are connected to associated electrical leads on that circuit board. The latter is accomplished by conventional soldering technique. As illustrated in the enlarged partial side view of FIG. 6, which is taken along line 6—6 in FIG. 5, a short length of the covering polyimide layer 5b is removed from an end of the cable to expose the electrical leads 12, the upper covering layer 5a remaining unchanged, the exposed electrical leads 12 are aligned with the corresponding electrical leads 11 on the circuit board; and solder is applied to mechanically and electrically join leads 12 and lines 11 together.

Returning to FIGS. 4 and 5, cable 5 and circuit board 1 are clamped together between bars 19 and 21, located at the rear end of the connector. Narrow flat rectangular metal bar 19 abutting the upper cable surface serves as one clamp and the complementary more thin flat bar 21 located abutting the opposite or bottom surface of the circuit board serves as the complementary clamp bar. Each such bar extends across the width of the printed circuit board and covers a fraction of the circuit board's length. Bar 19 contains a clearance hole at each end and bar 21 contains tapped holes, aligned with the holes in the complementary clamp bar 19. Bolts 20 and 23 fit through the respective passages in bar 19, underlying aligned passages in printed circuit board 1 and are threaded into the respective tapped holes in bar 21. The clamp provides a strain relief for cable 5, preventing any pulling force on cable from reaching the soldered lead connections with the circuit board and breaking one or more electrical connections.

Relatively rigid printed circuit board 1 also contains at least two spaced alignment holes 25 and 27, which are used to properly position the interposer 9, as later herein described.

Figure 9:
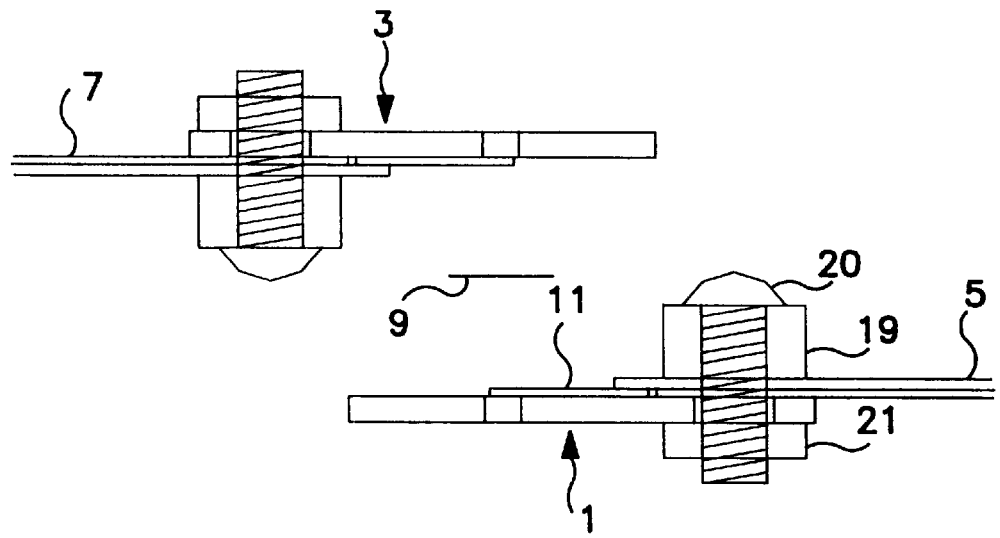
FIGS. 9, 10 and 11 illustrate the assembly of a cable to cable connector into a completed connector and the clamping structure.

Temporary reference is made to FIG. 9 which shows both connector 1 and connector 3 in side view. The remaining connector 3 to the connector system is of the same structure already illustrated and described in respect to connector 1, which need not be repeated. Connector 3 is also connected to its associated electrical cable 7 in the same manner as that used for connector 1, which is also not here repeated.

Figure 7:
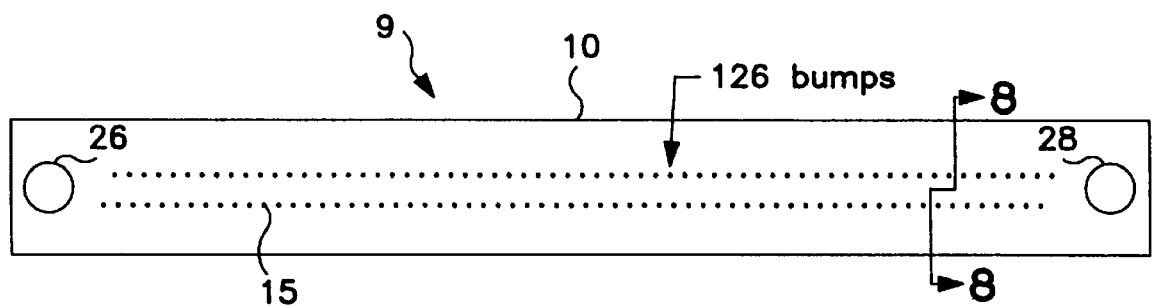
FIG. 7 illustrates the interposer element in top plan view drawn to a larger scale than the companion component of FIG. 4, with the bottom view of the interposer element being a mirror image of the top.

The interposer 9 for this embodiment is illustrated in top plan view in FIG. 7, to which reference is made, and is drawn to a slightly larger scale than FIG. 4. The element is formed of a very thin rectangular layer or strip 10 of plastic film material that is electrically non-conductive, suitably a 2 mil layer of Polyimide. The strip is relatively flexible relative to the stiffness of the circuit boards 1 and 3, which are relatively rigid. The strip is sufficient in length to extend across the width of those printed circuit boards.

Malleable metal bumps 15, which serve as electrical contacts, protrude from the upper surface of the film. Those bumps are arranged in two spaced parallel rows, spaced along the strip's length front to rear, the Y-direction in the figure, with one row vertically above the other as illustrated in the figure. A like arrangement is used for the bumps on the opposite side of the strip, wherein each bump on the upper surface vertically overlies a corresponding metal bump protruding from the strip's bottom surface. Arranging the metal bumps on a side in staggered rows allows a greater clearance space between metal bumps. That greater clearance minimizes the chance that a solder splash or metal dendrite will bridge between adjacent bumps to create a cross-circuit between conductors in the connector.

The spacing between bumps along the width or the X-direction in the figure is the same spacing used with the conductors in the connector 1 and in connector 3. The spacing between adjacent bumps in the same row is twice the foregoing distance. The contacts may be arranged in three or more rows in other embodiments should an even greater clearance space be desired or if it is desired to reduce the width of the connector.

Pin alignment holes 26 and 28 on the left and right ends of the strip 9 form passages through the thickness of the strip. Those passages are spaced apart by the same distance as pin alignment holes 25 and 27 in the connector illustrated in FIG. 4. The pin alignment holes permit bumps 15, and the corresponding metal bumps on the opposite side of the strip, to be properly aligned with the associated conductors on the printed circuit boards in connector components 1 and 3, when the connector is assembled together, as later herein described.

Figure 6:
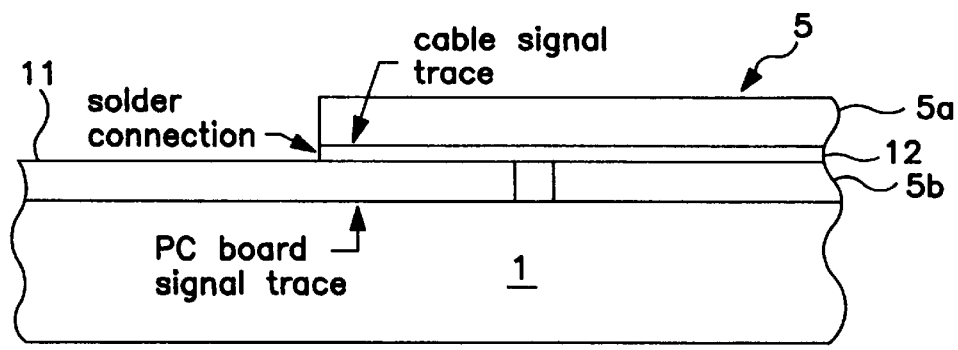
FIG. 6 is an enlarged partial side view of a portion of the view presented in FIG. 5.
Figure 8:
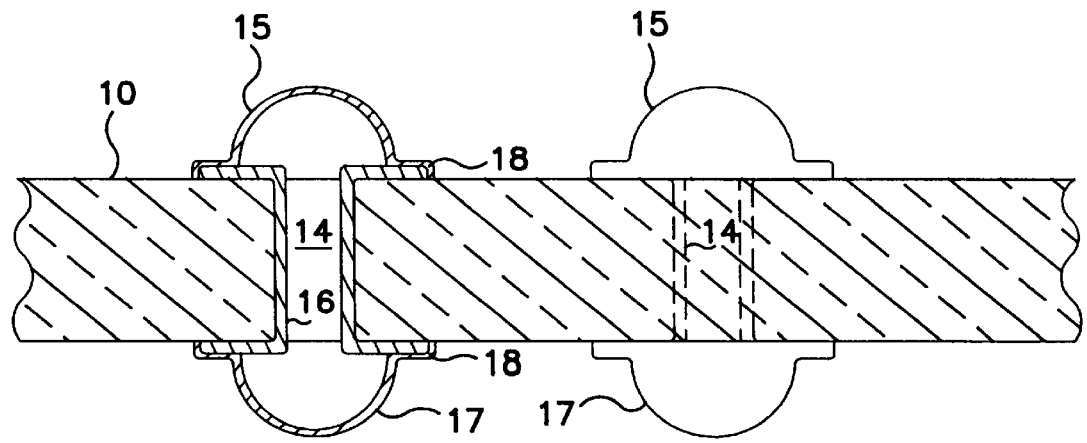
FIG. 8 is an enlarged section view of the interposer element taken along the lines 8—8 in FIG. 7.

As illustrated in enlarged scale in the side section view of FIG. 8, which is taken along the line 8—8 in FIG. 6, film 10 contains cylindrical holes 14. Those holes each contain a metal cylinder 16, extending from the top to the bottom, which is formed on the walls of the respective hole. The metal cylinder serves to electrically interconnect coaxially aligned bumps 15 and 17. In this embodiment the bumps 15 formed are semi-spheroidal in shape, are connected atop the bump pads 18, an annular metal plated area surrounding the entrances to the holes, and to the metal cylinder 16. In a practical embodiment, the bumps are five mils in diameter and overlie and underlie, respectively, through-hole passages in the strip that are of two mils in diameter; and the spacing of adjacent bumps in a row is 0.016 inches and the row spacing is 0.028 inches.

Figure 12:
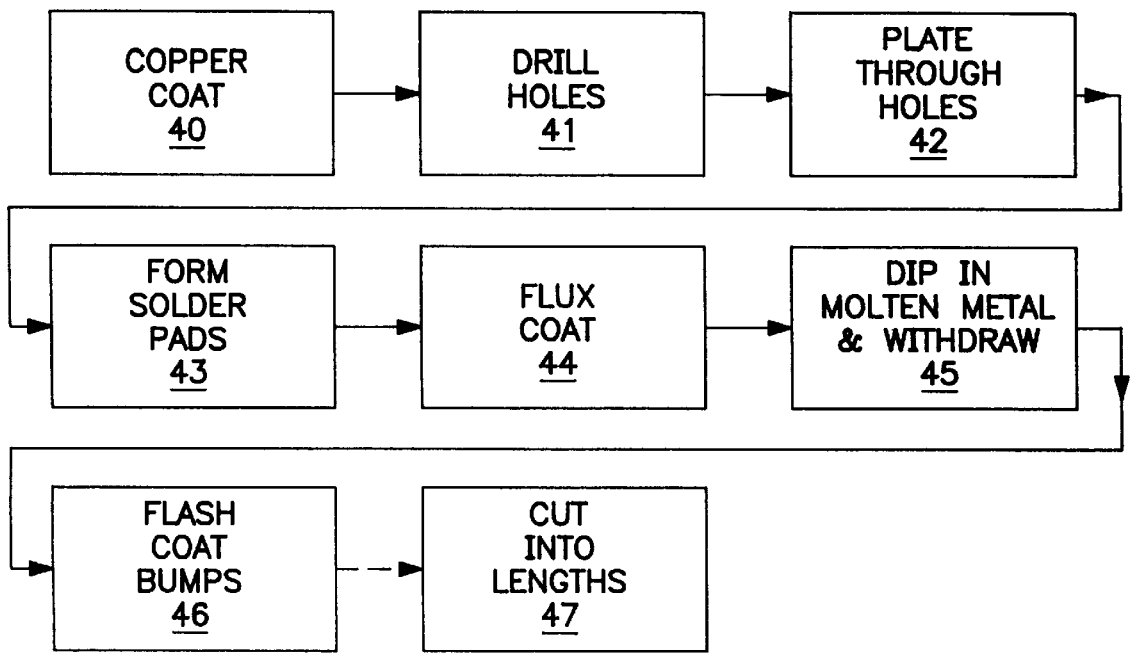
FIG. 12 illustrates the process for forming the interposer component of FIG. 4.

One process for fabricating the bumps on the interposer element, illustrated in FIG. 12, is considered. First, both sides of the polyimide film 10 are coated with copper as at 40. This is accomplished either by sputtering a seed layer of copper on both sides of the film and then electroplating the seed layer to build up a thicker layer of copper or by laminating copper foils directly to the film layer's surfaces with adhesive. Both techniques are known in the printed circuit board art. The holes 14 and the alignment holes 26 and 28 are then drilled through the plated layer with appropriate drilling apparatus, as at 41, which in the case of the minute holes employed in the example, is accomplished by laser machining techniques.

The holes are then plated through with a metal, as at 42, using conventional plate through plating processes well known in the printed circuit board art. The cylindrical walls defining the drilled holes are now covered with a metal, a metal cylinder, that forms an electrically conductive path between the top and bottom surfaces of the plated strip and that joins with the copper plating on the top and bottom surfaces.

The bump pads are then defined and formed, as at 43, by using photolithographic techniques. In this technicue, a photoresist material is applied to the film, and the photoresist is exposed in those areas which are to remain copper covered. The unexposed resist is removed, leaving only the bump pads and metalized through-holes covered with an acid resistant coating. Then all the copper, except for the bump pads and the plated through holes, which remain covered with an etch resistant layer, is etched away with a suitable etchant. The film layer is then washed to remove all traces of the etchant and the film layer is ready for further operation to form the metal bumps.

Both sides of the film layer subassembly are then brushed with a flux containing a part activating flux and part leveling flux, as at 44. The film is then dipped into a molten solder bath containing a eutectic indium/tin solder heated to approximately 130 degrees Centigrade, as at step 45. The film layer subassembly is then withdrawn from the bath and the solder which adhered to the exposed copper, such as on the bump pads and over and about the smaller connector contact holes, solidifies. In that action the solder wets the bump pads and, due to the inherent surface tension of the molten metal, it also forms a hemispherical bump over the ends of the plated through holes.

The physical phenomena that occurs to form the bump is much like observed by children in which a small magnifying lens is formed with water that is produced simply by dipping a small eyelet into water and withdrawing it. Due to its inherent surface tension, if the eyelet diameter is small enough, the water sticks to the eyelet and forms a convex shape meniscus, a hemispherical shape, defining the magnifying lens.

After the solder solidifies, the Indium-Tin bumps are coated with a thin layer of electroless gold plating, as at 46. For economy of scale in manufacturing the interposer, optionally, a single long strip containing many such interposers end to end may be processed in the foregoing manner in one continuous strip and, upon completion of that treatment, the strip is then cut into individual interposer strips, as at 47.

Figure 10:
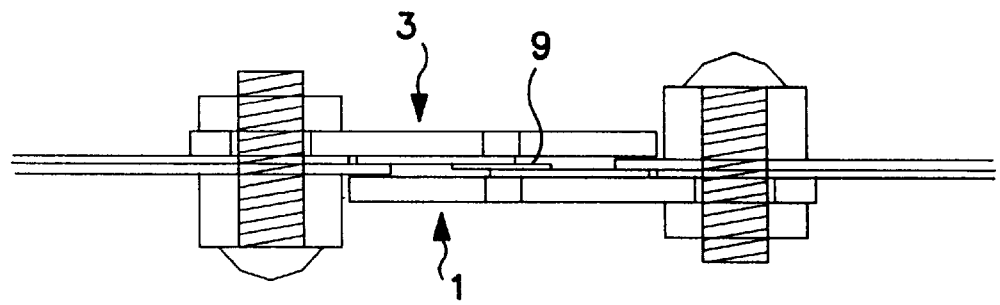
Figure 11:
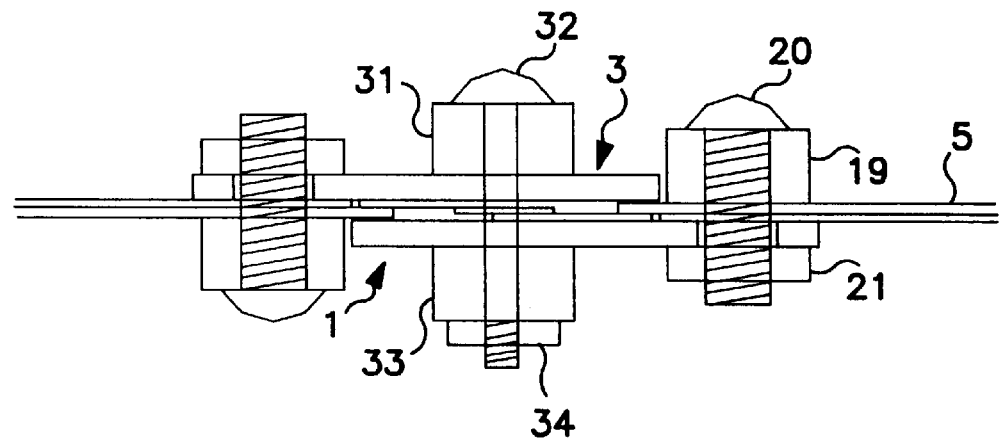

The described connector components are assembled together to complete a connection as illustrated in the side assembly views presented in FIGS. 9, 10 and 11 to which reference is made. As shown in FIG. 9, the connector components 1 and 3, previously assembled to respective cables 5 and 7, are arranged one over the other and the interposer 9 component is inserted in between and laid down atop the conductors 11 with its alignment holes overlying the corresponding alignment holes in connector 5. As shown in FIG. 10, connector component 3 is then brought down into contact with the interposer with its alignment holes aligned with the interposer's alignment holes. In that way the electrical contacts on interposer 9 are brought into contact with the metal traces on the adjoining connectors, and forms a bridging path between the trace on the circuit board of connector 1 to an associated trace on the complementary board of connector 3.

To hold the elements in the foregoing relationship and complete the connector a fastening structure is used that clamps the elements together. That clamping force also maintains the contacts under a positive pressure or force. Such a clamp is formed with upper and lower clamping bars 31 and 33, and bolts 32 and nuts 34. Each of the clamp bars is of a straight narrow rectangular box shape, as illustrated in end view in the figure, and is of a length that extends across the width of the connector.

Upper and lower clamp bars 31 and 33 are placed in contact with the respective rear surfaces of the circuit boards of connectors 3 and 1, respectively, with their alignment holes in alignment with the corresponding alignment holes in each of those circuit boards. Bolts 32, only one of which is illustrated, are inserted through the holes and are fastened in place with nuts 34, only one of which is illustrated. The fastened bolts thereby maintain the components in the illustrated sandwich relationship. The bolts and nuts exert force on the adjacent clamping bars, and the bars distribute such clamping force across the entire underlying surfaces.

Preferably a portion of the bolt's shank leading from the bolt head is left unthreaded, leaving a smooth cylindrical surface of a diameter just small enough to clear the cylindrical walls of the alignment holes in the circuit boards and interposer. The foregoing structural feature allows the fastening bolt to serve also as an alignment pin that ensures that the parts remain in the desired alignment through final assembly.

The connector remains effective at cryogenic temperatures. When cooled all of the metal parts contract with temperature as would enhance firm electrical contact between the elements. By intent, the interposer is the one element which is intended to give way under such pressures. The Indium-Tin bumps on the interposer yield and flare against the added reverse thermally induced force. When the equipment is to be disengaged and removed, the cryogenic temperatures are removed and the unit is brought back to room temperature. The connector is easily dissassembled by unfastening the nut, removing the clamping structure and detaching the component elements, in essentially a reverse procedure to that earlier described in connection with assembly in FIGS. 8 through 10. Because the bumps on the interposer were distorted, as described above, the interposer is discarded. When the connection is again to be made, a new interposer is substituted, thereby making the connector as good as new.

As earlier described, the interposer is a simple structural element and may be constructed almost entirely by automated fabrication equipment, making it a relatively inexpensive component. Instead of requiring substitution of a new connector and the attendant labor of rewiring a new connector to the cable, great savings in both time and effort are achieved by merely inserting a new self-contained component into place.

Figure 13:
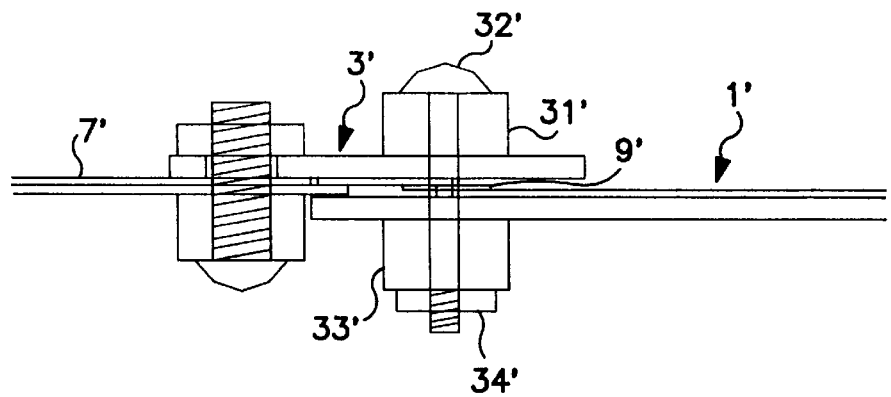
FIG. 13 illustrates a cable to circuit board embodiment of the connector system.

The foregoing illustrated a cable to cable connection. It is appreciated that the foregoing connector also may be used for a cable to circuit board connection, such as is illustrated in side view in FIG. 13. In this embodiment, the left connector 3' is of the same construction illustrated in FIGS. 4, 5 and 6. However, the second connector portion 1' is the edge of the equipment's printed circuit board, which substitutes for the second connector portion. That equipment circuit board contains appropriate alignment holes. And the interposer 9' and the associated clamping device 31', 32', 33' and 34', is the same as in the connector structure earlier described.

Many additional variations are possible. The metal bumps used in the foregoing embodiment were formed of an Indium-Tin, a metal that possesses the requisite degree of malleability. However other malleable metals may be substituted for Indium-Tin in the combination that possesses a Moh's hardness rating within the range of 1.2, the hardness rating of pure Indium, to 3.0, the hardness rating of Gold.

Further, the foregoing embodiment used metal bumps that were formed of a spheroidal shape and were formed in a particular process. However, as those skilled in the art understand from reading this specification, the connector invention is not so limited as other shapes may be substituted and the metal protrusions may be formed by other processes. So long as the metal selected is malleable and compresses, the bump should properly function.

Additionally, the preferred embodiment has been illustrated in connection with connectors having very fine traces and using very minute sized metal bumps as exist for a particular cryogenic application known to the inventors, which gave rise to the problem solved by the disclosed connector. However, it is recognized that the disclosed connector structure may be adapted to larger or smaller size metal traces in the same or for different applications and may find application in other fields for related reasons.

Lastly, the metal bumps for the embodiment were fabricated using a specified dipping process. Other fabrication processes may be chosen instead. As example, the metal bumps may be separately formed and may be applied one by one by automated equipment to the ends of the holes and affixed by an electrically conductive epoxy. Alternatively they may be so positioned and then electrically welded. Notwithstanding, the dipping process is preferred for small diameter bumps, of five mils or less in diameter.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. The method of constructing an electrical connector which includes the steps of:

forming a plurality of holes through a thin elongate strip of electrical insulating material;

plating the walls of said holes with an electrically conductive metal to form plated-through holes; and dipping said thin elongate strip in a bath containing molten metal and withdrawing therefrom to form bumps of metal on each end of said plated-through holes.

2. The method as defined in claim 1, wherein said metal comprises an Indium-Tin alloy and further comprising the additional step of plating said bumps with a metal comprising Gold.

3. The method defined in claim 1, wherein said electrical insulating material comprises polyimide.

4. The method as defined in claim 1, further comprising the step of cutting said thin elongate strip containing said metal bumps on each end of said plated-through holes into a plurality of shorter thin elongate strips.

5. The method as defined in claim 1, further comprising the step, following said step of forming a plurality of holes, of plating an electrically conductive metal annuluses on the upper and lower surfaces of said strip surrounding the respective entrance and exit ends of each of said plurality of holes to define a plurality of bump pads.

* * * * *